United States Patent
Wu et al.

[11] Patent Number: 6,027,996
[45] Date of Patent: Feb. 22, 2000

[54] METHOD OF PLANARIZING A PRE-METAL DIELECTRIC LAYER USING CHEMICAL-MECHANICAL POLISHING

[75] Inventors: Jiunh-Yuan Wu, Hsinchu; Water Lur; Shih-Wei Sun, both of Taipei, all of Taiwan

[73] Assignee: United Microelectronics Corp., Taiwan

[21] Appl. No.: 08/885,173

[22] Filed: Jun. 30, 1997

[30] Foreign Application Priority Data

Apr. 29, 1997 [TW] Taiwan .................................. 86105589

[51] Int. Cl.⁷ ................................................ H01L 21/4763
[52] U.S. Cl. ........................... 438/624; 438/631; 438/633
[58] Field of Search ..................... 438/623, 624, 438/626, 631, 633

[56] References Cited

U.S. PATENT DOCUMENTS 5,290,727  3/1994  Jain et al. ................. 438/238
5,382,545  1/1995  Hong ......................... 438/624
5,403,780  4/1995  Jain et al. ................. 438/624
5,763,937  6/1998  Jain et al. ................. 257/646

*Primary Examiner*—John F. Niebling
*Assistant Examiner*—John Murphy
*Attorney, Agent, or Firm*—Rabin & Champagne, PC

[57] ABSTRACT

A method of planarizing a pre-metal dielectric layer using chemical-mechanical polishing, in order to alleviate the problem of resistance reduction when making products having poly-loads, includes providing a semiconductor substrate with a semiconductor component formed thereabove. A pre-metal dielectric layer is formed above the semiconductor substrate. Thereafter, the pre-metal dielectric layer is planarized using chemical-mechanical polishing. Next, a silicon-rich oxide layer, that has a characteristic gettering property which can be used to compensate for the weakening of the gettering ability of the pre-metal dielectric layer, due to the wearing out of the layer in a chemical-mechanical polishing operation, is formed above the pre-metal dielectric layer.

10 Claims, 2 Drawing Sheets

METHOD OF PLANARIZING A PRE-METAL DIELECTRIC LAYER USING CHEMICAL-MECHANICAL POLISHING

BACKGROUND OF THE INVENTION

1. Field of Invention

This invention relates in general to a method of forming an inter-layer dielectric (ILD) layer. More particularly, this invention is directed toward a method of planarizing a pre-metal dielectric (PMD) layer using a chemical-mechanical polishing (CMP) process.

2. Description of Related Art

In general, there are two types of dielectrics which are grouped under the title of inter-layer dielectric (ILD). The first type is a pre-metal dielectric (PMD), which refers generally to a dielectric material formed before a metallization process is performed. The PMD serves as an isolating layer between the semiconductor component and the first metallic layer. The second type of dielectric is an inter-metal dielectric (IMD), which is a dielectric layer interposed between two metallic layers for isolation.

Referring to FIGS. 1a and 1b, a conventional method of forming a PMD is shown. First, and referring to FIG. 1a, a semiconductor substrate 10, for example, a silicon substrate, having a semiconductor component 12 formed thereabove, is provided. The semiconductor component 12 is, for example, a MOS component having a gate and source/drain terminals. Thereafter, a PMD layer 14, for example, a borophosphosilicate glass (BPSG) layer formed using a chemical vapor deposition (CVD) method, is formed above the semiconductor substrate 10.

Referring next to FIG. 1b, the PMD layer 14 is subjected to a heat flow process using a high temperature between, for example, about 850° C. and about 950° C. Thus, the original undulating PMD layer 14, which generally followed the undulating profile of the semiconductor component 12, becomes smoother and somewhat planarized.

Although the heat flow process can smooth the profile of the PMD layer a little, the result is usually not sufficiently smooth. Therefore, additional techniques, such as applying a spin-on glass (SOG) coverage followed by an etching back procedure, often have to be used to provide the local planarization.

However, manufacturers are entering a sub-half micron manufacturing era. As such, in order to meet the processing window requirements for various processes, such as photolithography, etching and deposition, chemical-mechanical polishing (CMP) is generally used for global planarization. Hence, CMP is also used for the planarization of the aforementioned PMD layer.

Furthermore, after the planarization of the PMD layer, a pure oxide layer is typically formed, for example, a PE-OX (plasma enhanced chemical vapor deposition oxide) or a PE-TEOS (plasma-enhanced chemical vapor deposition tetraethylorthosilicate) layer, so as to cover up defects, such as scratches, formed during the CMP operation. Nevertheless, because of the thinning of the layer as a result of polishing, and due to the immersion in grinding fluids while undergoing the CMP operation, after the CMP operation is performed, the gettering effect for the PMD layer will be weakened. This will lead to a lower resistance for poly-loads in products that contain such items, for example, SRAMs, after the subsequent inter-metal dielectric formation, thereby causing production yield problems.

SUMMARY OF THE INVENTION

It is therefore an object of this invention to overcome the problems caused by the polishing of the PMD layer using CMP, so that production yield will not be affected by the planarization process.

To achieve the above and other objects, a method for planarizing the pre-metal dielectric layer using chemical-mechanical polishing is provided, which involves providing a semiconductor substrate with a semiconductor component formed thereabove. A pre-metal dielectric layer is formed above the semiconductor substrate. The pre-metal dielectric layer is planarized using chemical-mechanical polishing. A silicon-rich oxide layer is formed above the pre-metal dielectric layer.

BRIEF DESCRIPTION OF THE DRAWINGS

Other objects, features, and advantages of the invention will become apparent from the following detailed description of the preferred but non-limiting embodiment. The description is made with reference to the accompanying drawings, in which.

DESCRIPTION OF THE PREFERRED EMBODIMENT

Figure 1A:
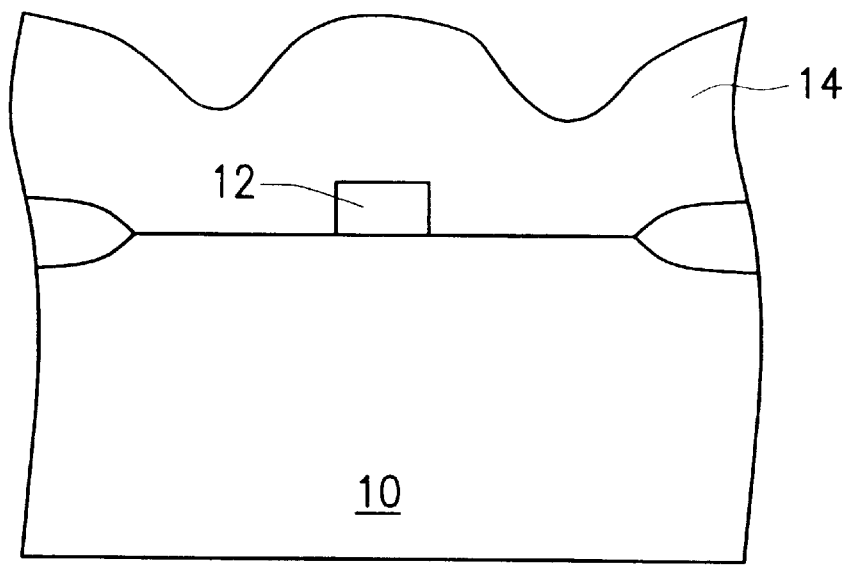
FIGS. 1a and 1b are cross-sectional views showing a conventional processing flow for forming a pre-metal dielectric layer.
Figure 1B:
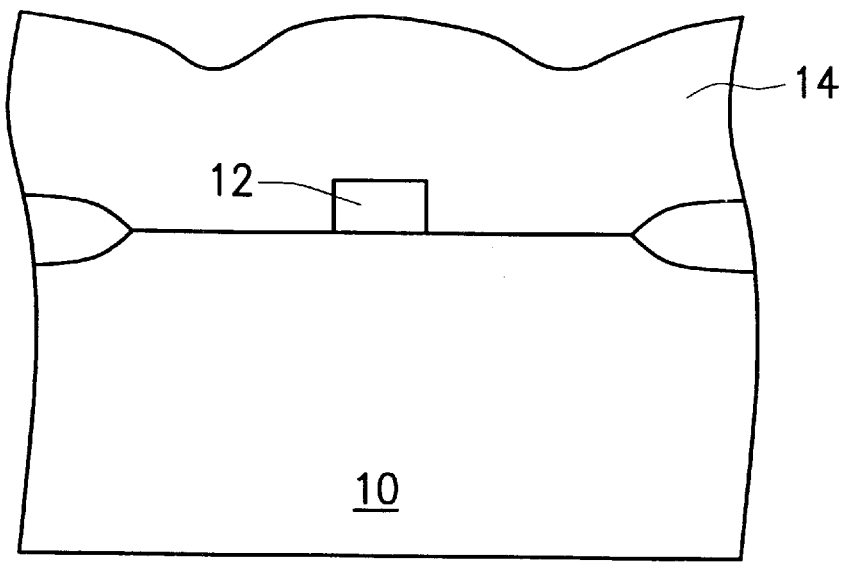
Figure 2A:
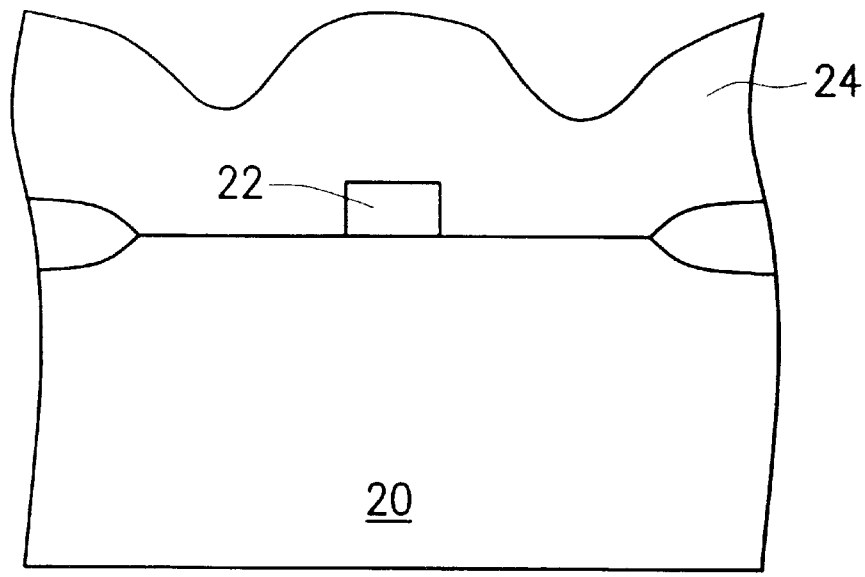
FIGS. 2a and 2b are cross-sectional views showing a processing flow for forming a planarized pre-metal dielectric layer using chemical-mechanical polishing, according to this invention.

Referring to FIG. 2a, a semiconductor substrate 20, having a semiconductor component 22 formed thereabove, is provided. The semiconductor substrate 20 can be, for example, a silicon semiconductor substrate. The semiconductor component 22 can be, for example, a MOS component having a gate and source/drain regions. Thereafter, and prior to performing a subsequent metallization process, a pre-metal dielectric (PMD) layer 24, for isolating the semiconductor component 22 from the metallic wiring, is deposited above the semiconductor substrate 20. The PMD layer 24 can be, for example, a borophosphosilicate glass (BPSG) layer formed using chemical vapor deposition (CVD).

Figure 2B:
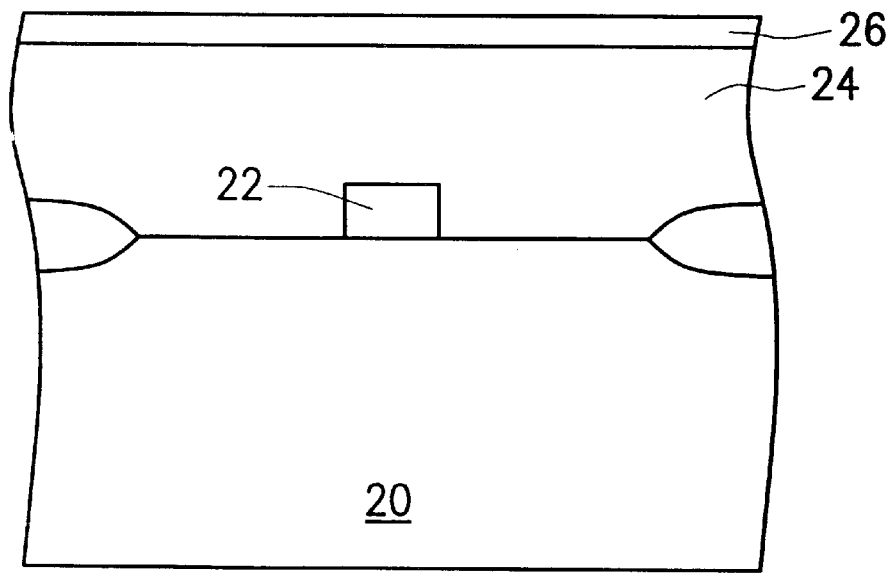

Referring next to FIG. 2b, chemical-mechanical polishing (CMP) is used to globally planarized the pre-metal dielectric layer 24. Then, a silicon-rich oxide (SRO) layer 26 is formed above the planarized pre-metal dielectric layer 24. The silicon-rich oxide layer 26 can be formed, for example, using plasma enhanced chemical vapor deposition (PECVD). The silicon-rich oxide layer 26 can have a thickness of about 500 Å to about 3000 Å, a refractive index (RI) of about 1.47 to 1.54 (which is much higher than the RI of a normally formed oxide layer, of between 1.45 to 1.46), and a compressive stress of about $1 \times 10^8$ to $9 \times 10^9$ dynes/$cm^2$.

The aforementioned method has certain advantages over the conventional method, such as:

1. The global planarization of the PMD layer using CMP increases the processing window in subsequent photolithographic, etching and deposition processes.
2. Defects, such as surface scratches on the PMD layer, can be rectified.
3. The reduction of the PMD material, such as BPSG, caused by the CMP operation, can be rectified.
4. The SRO layer deposited above the PMD layer has a number of dangling bond defects. Thus, the SRO layer can be used to compensate for lost material, such as BPSG which constitutes the bulk of the PMD layer.

Hence, problems caused by the weakening of the gettering effect, are reduced.

5. When the invention is applied to a process requiring the formation of a poly-load, for example, in SRAM production, due to the similar gettering ability for the SRO layer, mobile ions generated in back-end processes, for example, ions formed by the breakup of Si-H or Si-H bonds in SOG or PE-TEOS films, can be easily trapped. Hence, the problem of resistance reduction, caused by chemical-mechanical polishing, can be eliminated, and production yield restored.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims, which define the invention, should be accorded the broadest interpretation so as to encompass all such modifications and similar structures.

What is claimed is:

1. A method of planarizing a pre-metal dielectric layer, comprising:

providing a semiconductor substrate with a semiconductor component formed thereabove;

forming a pre-metal dielectric layer above the semiconductor substrate, said forming causing said pre-metal dielectric layer to have an uneven surface topography;

planarizing the pre-metal dielectric layer using chemical-mechanical polishing to planarize the uneven surface topography; and forming a silicon-rich oxide layer above the planarized pre-metal dielectric layer, wherein the forming a silicon-rich oxide layer forms the silicon-rich oxide layer in direct contact with the pre-metal dielectric layer at all areas of the pre-metal dielectric layer disposed directly above the semiconductor component.

2. The method according to claim 1, wherein said providing a semiconductor substrate includes providing a silicon semiconductor substrate.

3. The method according to claim 1, wherein said providing a semiconductor substrate includes providing the semiconductor component with a gate and source/drain regions.

4. The method according to claim 1, wherein said forming a pre-metal dielectric layer includes forming the pre-metal dielectric layer of a borophosphosilicate glass layer.

5. The method according to claim 1, wherein said forming a silicon-rich oxide layer includes using plasma enhanced chemical vapor deposition.

6. The method according to claim 1, wherein said forming a silicon-rich oxide layer includes forming the silicon-rich oxide layer to a thickness of about 500 Å to about 3000 Å.

7. The method according to claim 1, wherein said forming a silicon-rich oxide layer includes forming the silicon-rich oxide layer with a refractive index between about 1.47 and about 1.54.

8. The method according to claim 1, wherein said forming a silicon-rich oxide layer includes forming the silicon-rich oxide layer having a compressive stress between about $1 \times 10^8$ and about $9 \times 10^9$ dynes/cm$^2$.

9. The method according to claim 1, wherein the forming a pre-metal dielectric layer forms the pre-metal dielectric layer over the semiconductor component to cover and insulate the semiconductor component.

10. The method according to claim 1, wherein the forming a silicon-rich oxide layer forms the silicon-rich oxide layer to have an essentially planar, entire upper surface.

* * * * *